(12) United States Patent
Shea

(10) Patent No.: US 10,164,088 B2
(45) Date of Patent: Dec. 25, 2018

(54) TRENCH MOSFET WITH DEPLETED GATE SHIELD AND METHOD OF MANUFACTURE

(71) Applicant: Great Wall Semiconductor Corporation, Tempe, AZ (US)

(72) Inventor: Patrick M. Shea, Oviedo, FL (US)

(73) Assignee: Great Wall Semiconductor Corporation, Tempe, AR (US)

( * ) Notice: Subject to any disclaimer, the term of this patent is extended or adjusted under 35 U.S.C. 154(b) by 6 days.

(21) Appl. No.: 15/452,594

(22) Filed: Mar. 7, 2017

(65) Prior Publication Data

US 2017/0179277 A1    Jun. 22, 2017

Related U.S. Application Data

(63) Continuation-in-part of application No. 15/205,920, filed on Jul. 8, 2016.
(Continued)

(51) Int. Cl.
*H01L 29/78* (2006.01)
*H01L 29/66* (2006.01)
(Continued)

(52) U.S. Cl.
CPC ........ *H01L 29/7813* (2013.01); *H01L 29/407* (2013.01); *H01L 29/4916* (2013.01);
(Continued)

(58) Field of Classification Search
CPC . G05F 3/00; G05F 3/205; G05F 3/242; G05F 3/245; G05F 3/247; G05F 3/262;
(Continued)

(56) References Cited

U.S. PATENT DOCUMENTS 8,962,425 B2    2/2015  Shen et al.
2010/0044785 A1*  2/2010  Murphy ............ H01L 29/66727
                                                    257/330
(Continued)

OTHER PUBLICATIONS

Chen et al., "Embedded TFT NAND-Type Nonvolatile Memory in Panel", "Electronic Device Letters, Jun. 2007", , pp. 499-501, vol. 28, No. 6, Publisher: IEEE.
(Continued)

*Primary Examiner* — Lincoln Donovan
*Assistant Examiner* — David Mattison
(74) *Attorney, Agent, or Firm* — Foley & Lardner LLP

(57) ABSTRACT

A semiconductor device, method of manufacture of a semiconductor device, and electronic system are disclosed. For example, the semiconductor device includes at least one trench disposed in a semiconductor substrate of the semiconductor device, wherein the semiconductor substrate has a first conductivity type. The semiconductor device further includes a polysilicon depleted gate shield disposed in the at least one trench, wherein the polysilicon depleted gate shield has a second conductivity type. The semiconductor device also includes a drift region disposed in the semiconductor substrate adjacent to at least one sidewall of the at least one trench, wherein the drift region has the first conductivity type, and a polysilicon gate disposed over the depleted gate shield in the at least one trench.

16 Claims, 12 Drawing Sheets

Related U.S. Application Data

(60) Provisional application No. 62/190,341, filed on Jul. 9, 2015.

(51) Int. Cl.
  *H01L 29/40* (2006.01)
  *H01L 29/49* (2006.01)
  *H01L 29/417* (2006.01)

(52) U.S. Cl.
  CPC .. *H01L 29/66734* (2013.01); *H01L 29/41766* (2013.01); *H01L 29/66727* (2013.01)

(58) Field of Classification Search
  CPC . H01L 29/00; H01L 29/407; H01L 29/41766; H01L 29/4916; H01L 29/66727; H01L 29/66734; H01L 29/7813
  USPC .......................................................... 327/543
  See application file for complete search history.

(56) References Cited

U.S. PATENT DOCUMENTS

| | | | |
|---|---|---|---|
| 2012/0187474 A1* | 7/2012 | Rexer | H01L 29/407 257/330 |
| 2012/0313161 A1 | 12/2012 | Grivna et al. | |
| 2017/0012111 A1 | 1/2017 | Shea | |
| 2017/0047843 A1 | 2/2017 | Bawa | |

OTHER PUBLICATIONS

Lai et al., "A Highly Stackable Thin-Film Transistor (TFT) NAND-Type Flash Memory", "2006 Symposium on VLLSI Technology Digest of Technical Papers", , pp. 1-2.

* cited by examiner

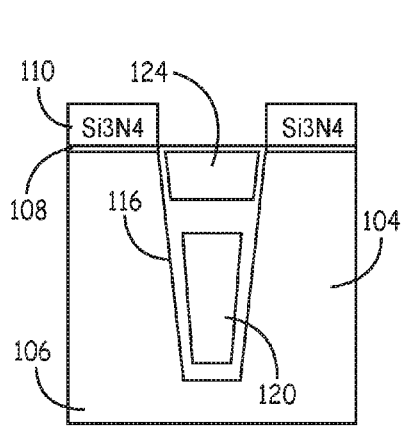
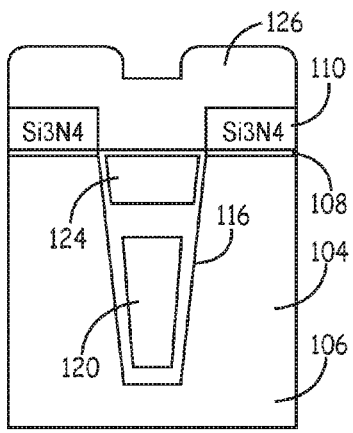
FIG. 1G             FIG. 1H
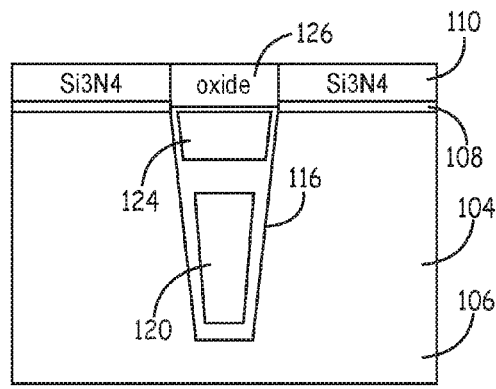
FIG. 1I
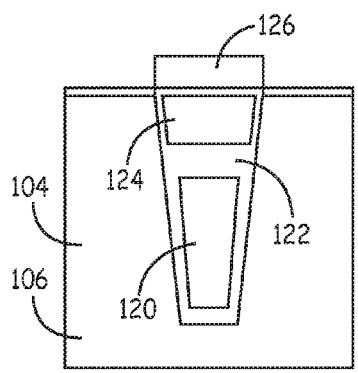
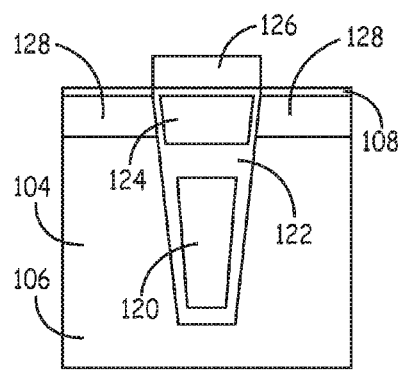
FIG. 1J             FIG. 1K Active Channel Region Gate Contact Region Shield Contact Region Active Channel Region

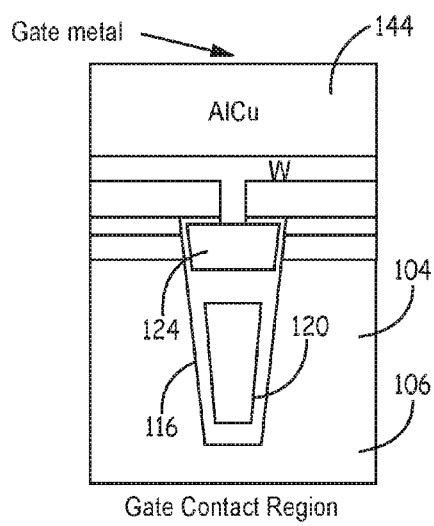
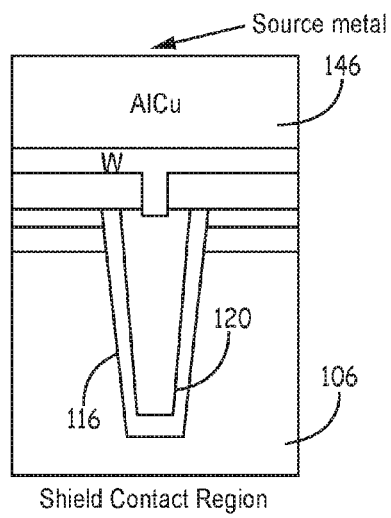
FIG. 1V    FIG. 1W
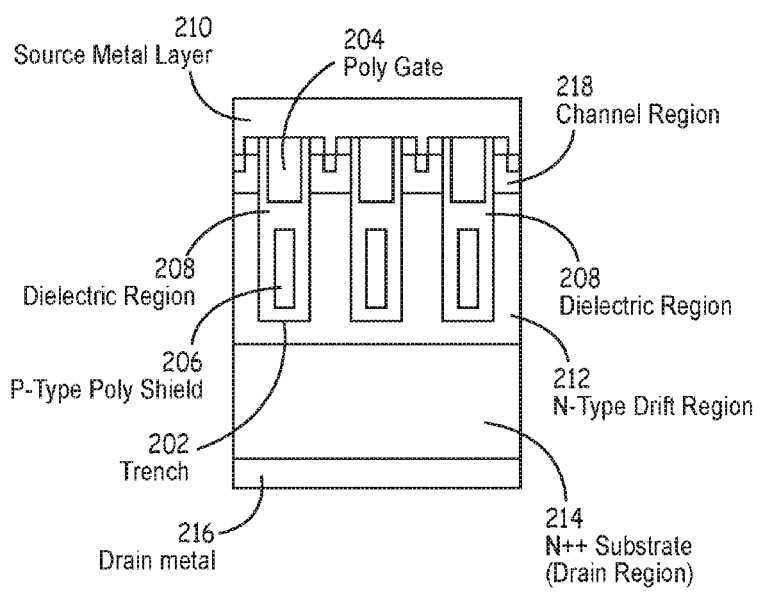
FIG. 2

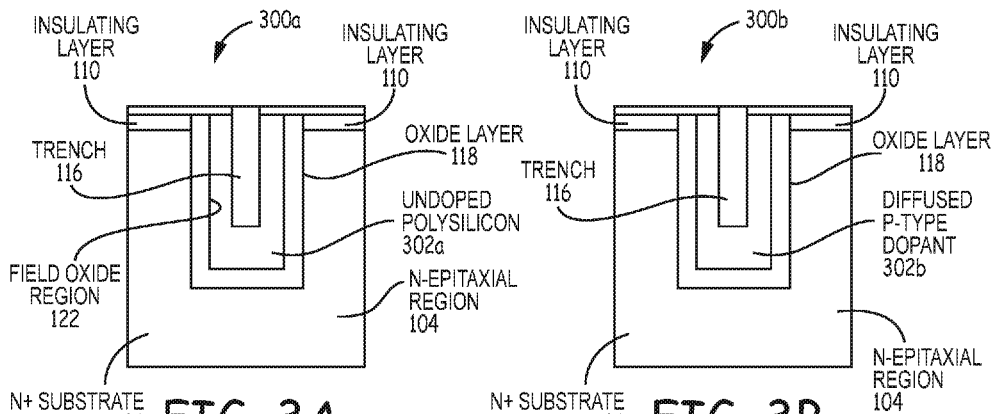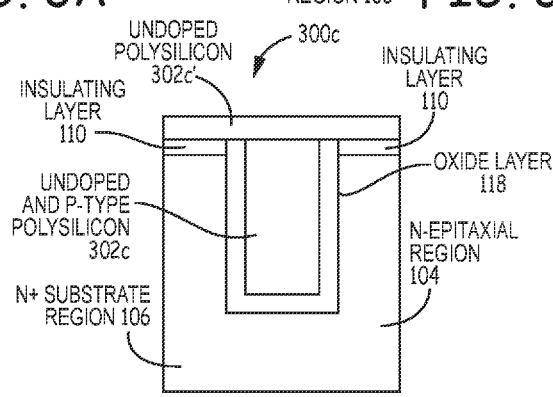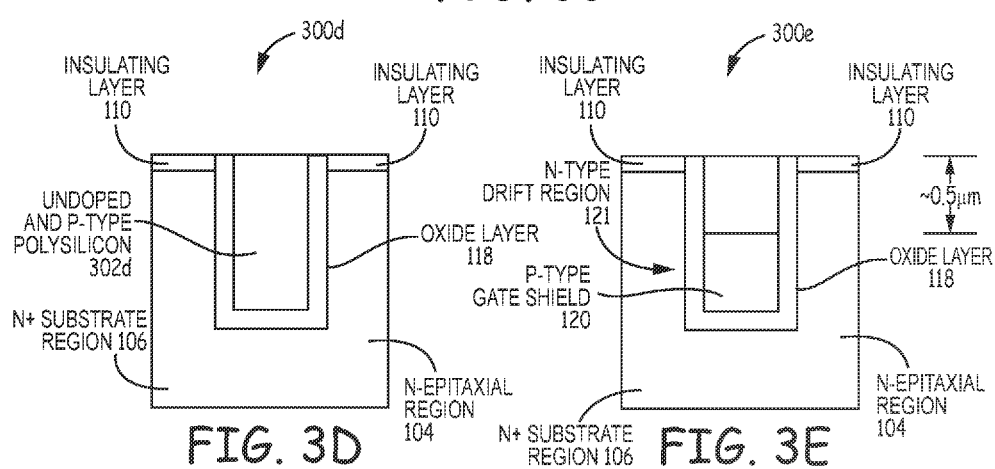

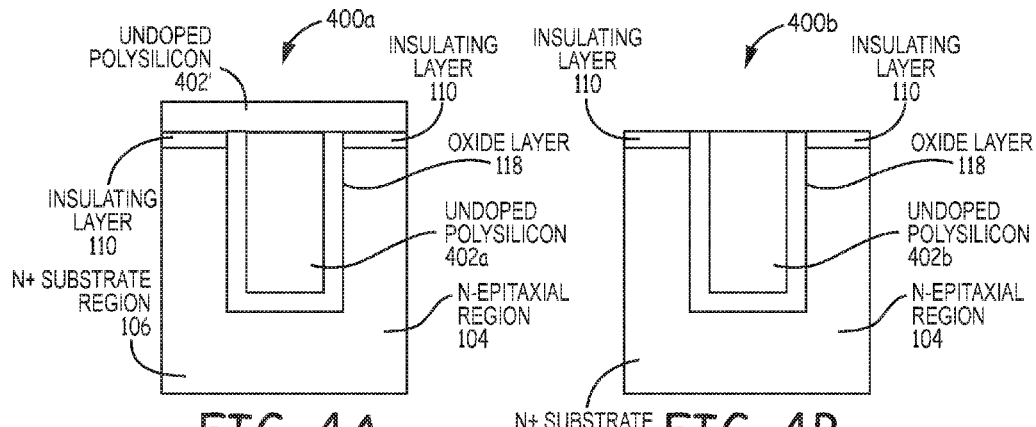
FIG. 4A
FIG. 4B
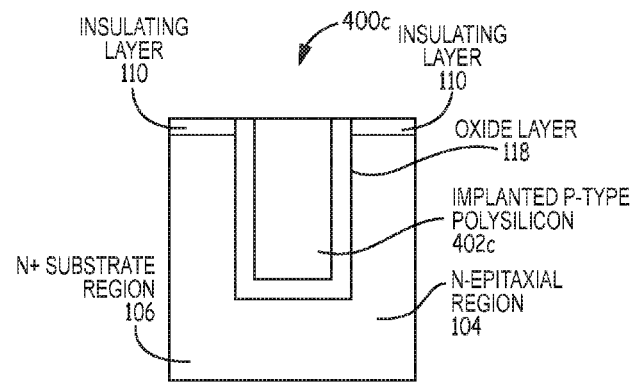
FIG. 4C
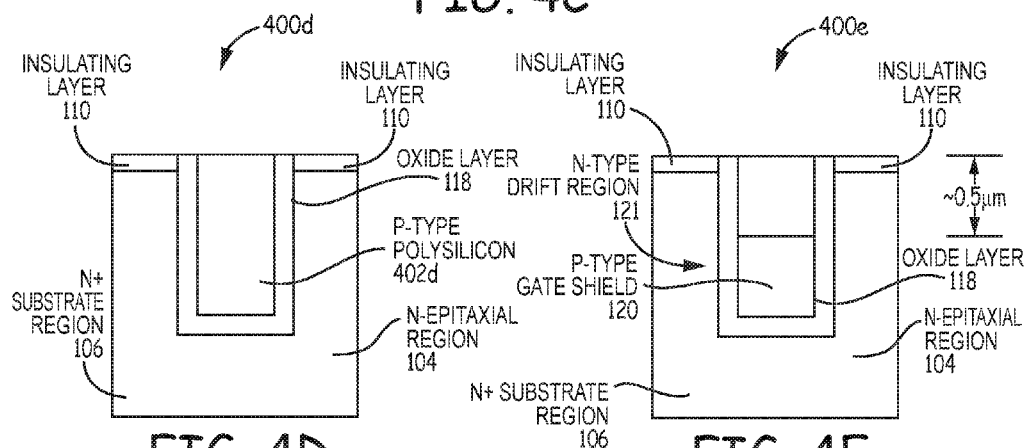
FIG. 4D
FIG. 4E

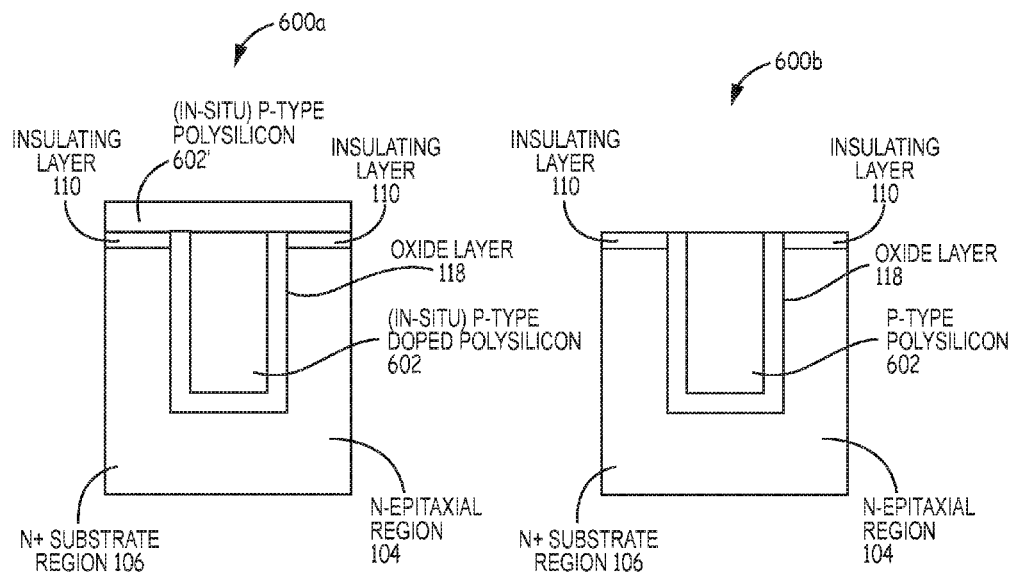
FIG. 6A
FIG. 6B
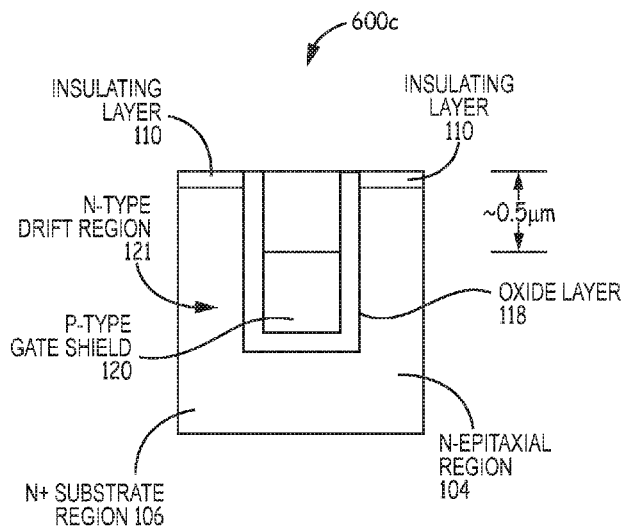
FIG. 6C

TRENCH MOSFET WITH DEPLETED GATE SHIELD AND METHOD OF MANUFACTURE

CROSS-REFERENCE TO RELATED APPLICATIONS

This application is related to, and claims the benefit of, U.S. Provisional Patent Application Ser. No. 62/190,341 ('341 application) entitled "CELL PITCH WITH SIDEWALL IMPLANTED TRENCH FETS," filed on Jul. 9, 2015, and is a Continuation-In-Part of U.S. patent application Ser. No. 15/205,920 ('920 application") entitled "TRENCH MOSFET WITH DEPLETED GATE SHIELD AND METHOD OF MANUFACTURE," filed on Jul. 8, 2016, both of which are incorporated herein by reference. This application hereby claims to the benefit of both the '341 and '920 applications.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings.

FIG. 2 depicts a cross-sectional view of a semiconductor device that can be formed utilizing the exemplary method depicted in FIGS. 1A-1W.

FIGS. 3A-3E depict an exemplary diffusion process that can be utilized to control the dopant type and doping concentration of the p-type shield in order to enable depletion to occur in the exemplary embodiment depicted in FIG. 1E.

FIGS. 4A-4E depict an exemplary implantation process that can be utilized to control the dopant type and doping concentration of the p-type shield in order to enable depletion to occur in the exemplary embodiment depicted in FIG. 1E.

FIGS. 6A-6C depict an exemplary in-situ doping process that can be utilized to control the dopant type and doping concentration of the p-type shield in order to enable depletion to occur in the exemplary embodiment depicted in FIG. 1E.

DETAILED DESCRIPTION

Figure 1A:
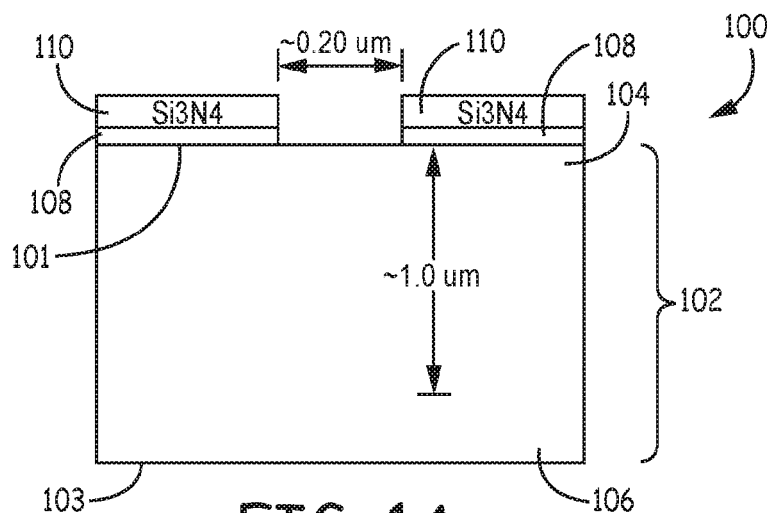
FIGS. 1A-1W depict a process for forming a trench MOSFET cell with a depleted gate shield, which can be utilized to implement one or more exemplary embodiments of the present invention.

In the following detailed description, reference is made to the accompanying drawings that form a part hereof, and in which are shown by way of specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be construed in a limiting sense. Wherever possible, the same or like reference numbers are used throughout the drawings to refer to the same or like structural components or parts.

Metal-oxide-semiconductor field effect transistors (MOSFETs) are commonly utilized in electronic circuits, such as, for example, communication systems, power supplies, and the like. Power MOSFETs are commonly utilized in power supply and/or power conversion applications, such as, for example, as electronic switches that can enable and disable the conduction of large currents (e.g., 5 A-100 A) in DC to DC power converters and the like. Power MOSFETs include a large number of MOSFET cells and/or individual transistor devices that are connected in parallel and distributed across the surface of a semiconductor die. In order to maximize power conversion efficiency, the power MOSFETs utilized must minimize both conduction and switching losses. Power MOSFET conduction losses are proportional to the drain-to-source resistance in the operation or "on" state (RDSON) of the transistor device involved. Switching losses are proportional to the switching frequency and internal parasitic capacitance, and most significantly, to the gate-to-drain capacitance (Cgd) of the transistor device involved. Trench power MOSFETs are thus widely utilized in switching applications due to their characteristically low RDSON.

Trench power MOSFETs utilize a "shielded" gate or "split" gate architecture to improve the tradeoff between breakdown voltage (BV) and RDSON. Under the split gate architecture, a dielectrically isolated shield is formed under the polysilicon gate within a trench in a cell of the MOSFET device. The shield is electrically connected to the source terminal of the MOSFET device. Although incremental improvements have been made to improve the tradeoff between BV and RDSON (e.g., through feature size scaling techniques) of existing devices, these improvements have been made at the expense of increased manufacturing complexity.

A more pressing concern for manufacturers of shielded gate trench power MOSFETs is the tradeoff between reduced on resistance (RON) versus increased gate-to-source capacitance (Cgs) and drain-to-source capacitance (Cds) across the field oxide adjacent to the shield. For example, an in-situ doped N+ polysilicon material is typically utilized to form the shield. Consequently, the parasitic output capacitance (COSS) of the MOSFET device is dominated by the surface area of the polysilicon shield and the thickness of the oxide adjacent the shield. As a result, a significantly high electric field is generated across the oxide adjacent the shield when the MOSFET device is in the "off" or non-operational state. This result requires the manufacturers to utilize a thick layer of oxide adjacent the shield to ensure the reliability of the MOSFET device against the adverse effects of such events as hot carrier injections and time-dependent dielectric breakdowns. As described below, the present invention resolves these and other, related problems with a depleted shield, split gate trench power MOSFET device formed on an integrated circuit, wafer, chip or die.

In accordance with the teachings of the present application, a depleted gate shield is formed in a trench in a split gate trench power MOSFET device. The depleted gate shield, which is a dopant type opposite to that of the drift region adjacent the trench, significantly reduces the magnitude of the electrical field in the oxide material adjacent the shield and in the trench, and thereby transfers a substantial amount of the stress generated by the electric field to the polysilicon material of the shield while the power MOSFET device is in the "off" state. Consequently, the device manufacturer can utilize a significantly thinner (e.g., ~10 nm) than usual layer of oxide material adjacent the shield and, as a result, significantly reduce the overall width of the trench (e.g., from approximately 0.3 µm to approximately 0.2 µm) and the cell pitch of the device to produce a significantly lower than typical RDSON. The depleted gate shield trench power MOSFET device also significantly reduces its output capacitance (COSS) as a function of its drain-to-source voltage (Vds). As the gate shield is being depleted, the COSS is reduced or scaled down as a function of the width of the depletion area.

FIGS. 1A-1W depict a process for forming a trench MOSFET cell 100 including a depleted gate shield, which can be utilized to implement one or more exemplary embodiments of the present invention. In one embodiment, a plurality of MOSFET cells 100 can be electrically connected in parallel to form, for example, a power trench MOSFET device with a high current carrying capacity. The power MOSFET device can be an n-channel device or a p-channel device, where "n" denotes a negative carrier type (e.g., electron), and "p" denotes a positive carrier type (e.g., hole). As such, although the embodiment depicted herein is described in terms of a dopant species for an N-channel MOSFET (N-MOS) device, a second embodiment can utilize the opposite dopant type species to form a P-channel MOSFET (P-MOS) device.

FIG. 1A depicts a cross-sectional view of a semiconductor substrate 102 on which a trench MOSFET device 100 including a depleted gate shield can be formed. For this exemplary embodiment, the trench MOSFET 100 is an N-MOS device, and the substrate 102 is formed with an n-type (N+) semiconductor material, such as, for example, phosphorous, antimony or arsenic. The substrate 102 includes an active surface 101 and back surface 103 opposite the active surface 101. For this embodiment, an n-type epitaxial (n-epitaxial) region 104 is grown over the N+ substrate (drain) region 106. The thickness of the n-epitaxial region 104 is approximately 2 µm. A first insulating layer 108 (referred to herein as a thermal oxide layer) is formed over the active surface 101 utilizing, for example, a physical vapor deposition (PVD), chemical vapor deposition (CVD), thermal oxidation, or other suitable oxide deposition process. In this embodiment, the thermal oxide layer 108 is approximately 50 nm thick, and can be formed utilizing one or more layers of silicon dioxide (SiO2), tantalum pentoxide (Ta2O5), aluminum oxide (Al2O3), or other suitable material for such an insulating layer. In addition to insulating, the thermal oxide layer 108 also functions herein as a pad oxide layer to provide structural support.

Next, a second insulating or dielectric layer 110 (also referred to herein as a hard mask layer or insulating layer) is deposited on the thermal oxide layer 108. For this exemplary embodiment, the hard mask layer 110 is approximately 200 nm thick and is formed utilizing one or more layers of silicon nitride (Si3N4), silicon oxynitride (SiON), polyimide, benzocyclobutene (BCB), polybenzoxazoles (PBO), or other suitable dielectric material. The hard mask layer 110 is deposited on the thermal oxide layer 108 utilizing, for example, a PVD, CVD, screen printing, spin coating, spray coating, or other suitable deposition process. Notably, in this embodiment, both the thermal oxide layer 108 and hard mask layer 110 are utilized in combination as an etch stop for terminating the etching process at controllable depths during subsequent processing steps described below. For example, a photo-resist (PR) layer or mask is formed over the hard mask layer 110. A suitable portion of the PR layer is removed, and a photolithography (e.g., dry etch) process is utilized to remove a portion (e.g., approximately 0.20 µm wide) of the thermal oxide layer 108 and hard mask layer 110 down to the active surface 101 of polysilicon.

Figure 1B:
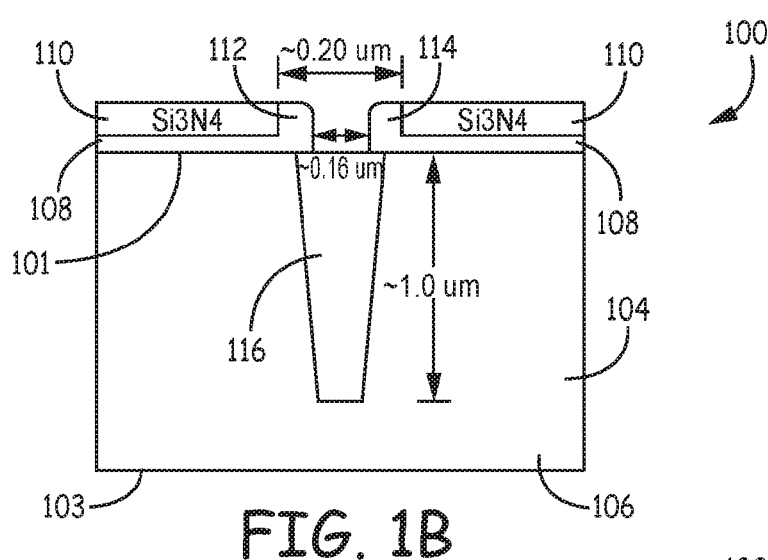
Figure 1C:
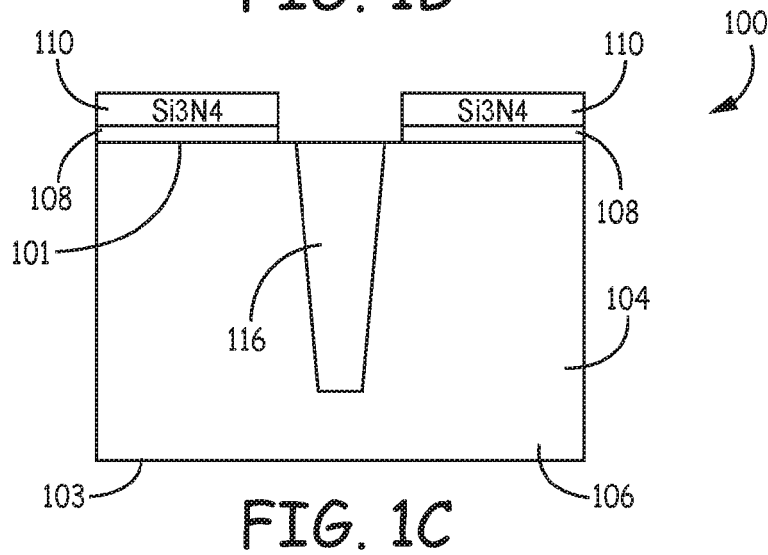

As shown in FIG. 1B, a suitable CMOS sidewall spacer formation process is then utilized to form a first sidewall spacer 112 and a second sidewall spacer 114 adjacent to the exposed sides of the thermal oxide layer 108 and hard mask layer 110. In this embodiment, the width of the spacers 112, 114 is approximately 200 nm, and the distance between the spacers 112, 114 is approximately 0.16 µm. A PR layer is then formed over the hard mask layer 110, a suitable portion of the PR layer is removed, and a photolithography or other suitable silicon etch process is utilized to form a trench 116 through the hard mask layer 110, the thermal oxide layer 108, the n-epitaxial region 104, and extending partially into the N+ region 106. Alternatively, the trench 116 can be formed utilizing a laser direct ablation (LDA) process. In this embodiment, the depth of the trench 116 is approximately 1 µm. Next, as shown in FIG. 1C, a suitable oxide wet etch process is utilized to remove the sidewall spacers 112, 114. A sacrificial oxide (Sac Ox) layer is then grown approximately 20 nm thick on the exposed surfaces in the trench 116. The Sac Ox layer is then removed utilizing a suitable oxide wet etch process.

Figure 1D:
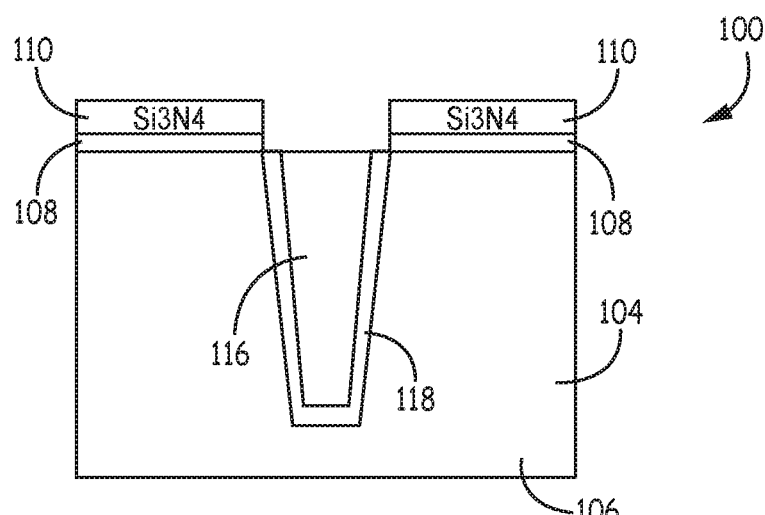
Figure 1E:
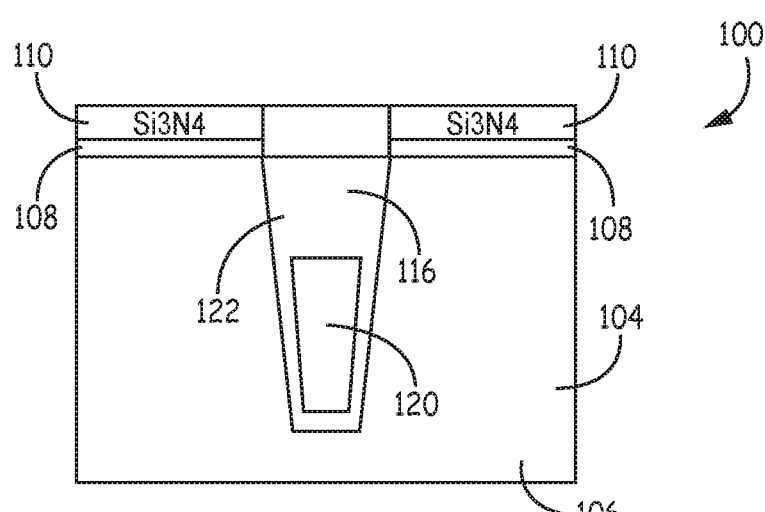

As shown in FIG. 1D, an oxide layer 118 is then grown on the exposed surfaces of the trench 116. In this embodiment, the thickness of the oxide layer 118 is approximately 300 Å. In FIG. 1E, a p-type gate shield 120 is formed within the trench 116. The trench 116 is filled with a suitable oxide material to form a field oxide or insulating region 122 adjacent the shield 120. The oxide region 122 can be formed, for example, utilizing a suitable dielectric insulating material, such as tetraethyl-orthosilicate (TEOS) deposited with a high temperature, low pressure deposition process, such as a vapor deposition process. In a second embodiment, the oxide region 122 can be formed utilizing another suitable dielectric insulating material, such as one or more layers of SiO2, Si3N4, SiON, Ta2O5, Al2O3, polyimide, BCB or PBO.

As described above, the gate shield 120 is formed with a suitable p-type polysilicon material and electrically connected to the source terminal of the MOSFET device. Notably, the polysilicon (p-type) shield 120 is doped oppositely of the N+ (drift) region in the substrate and adjacent to the trench 116 so that the shield 120 will be effectively depleted when the MOSFET device is turned off. For example, as described in more detail below with respect to FIGS. 3A-6C, in order to control the dopant type and doping concentration of the p-type shield 120 to enable the depletion to occur, a suitable diffusion process, implant process, or in-situ doping process can be utilized to form the shield 120. As a result, both the Cgs and Cds of the depleted gate shield trench MOSFET device are substantially reduced compared to existing trench MOSFET devices.

Figure 1F:
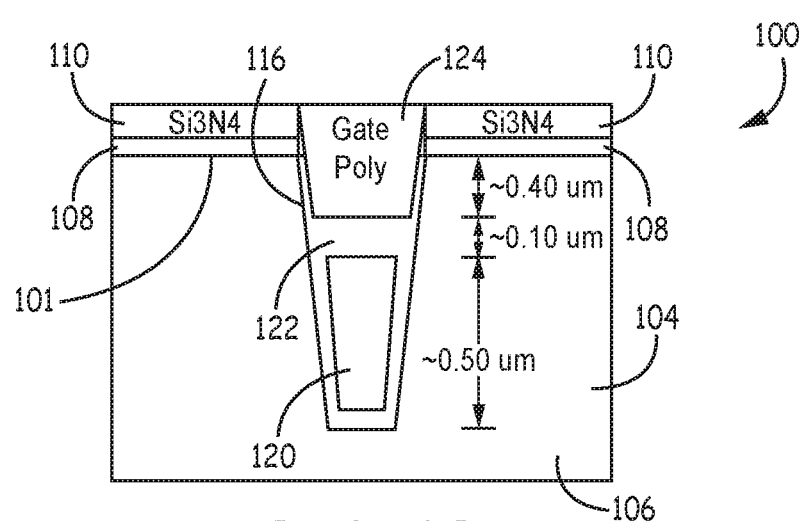

Returning to FIG. 1E, a suitable chemical-mechanical polishing or planarization (CMP) process is then utilized to smooth the surface of the oxide layer 122 down to the nitride material of the hard mask layer 110. Next, as shown in FIG. 1F, utilizing a PR mask and suitable oxide etch process, a portion of the field oxide region 122 over the shield 120 is removed. An oxide layer approximately 20 nm thick is then grown on the exposed surfaces. The "removed" region is then refilled with an N+ polysilicon material to form a gate structure or region 124. The surface of the N+ polysilicon material is then planarized down to the hard mask layer 110 utilizing a suitable CMP process. Notably, the hard mask layer 110 functions as a mask to protect the active surface 101 during the CMP process. As shown in FIG. 1F, for this exemplary embodiment, the polysilicon gate 124 extends approximately 0.40 µm into the n-epitaxial region 104, the distance between the polysilicon gate 124 and the shield 120 is approximately 0.10 µm, and the distance between the upper surface of the shield 120 and the bottom of the trench 116 is approximately 0.50 µm.

As shown in FIG. 1G, utilizing a suitable etch process, a portion of the polysilicon in the gate region 124 is removed down to the surface of the thermal oxide layer 108. A thermal oxidation process is then utilized to oxidize the polysilicon material in the gate region 124 to a depth of approximately 20 nm. As shown in FIG. 1H, utilizing a suitable oxide deposition process, a layer 126 of a suitable oxide material (e.g., SiO2) is deposited on the oxidized surface of the gate polysilicon region 124 and the hard mask layer 110. In this embodiment, the deposited oxide layer 126 is approximately 5000 Å thick. As shown in FIG. 1I, a suitable CMP process is then utilized to planarize the oxide layer 126 down to the level of the hard mask layer 110. Next, as shown in FIG. 1J, a suitable etch process is utilized to remove the nitride material of the hard mask layer 110. Then, as shown in FIG. IK, a suitable ion implantation process is utilized to deposit a p-type dopant (e.g., Boron, Aluminum or Gallium) with a typical concentration of approximately 5E17 cm-3 into the n-epitaxial region 104 to form the p-channel region 128.

Figure 1L:
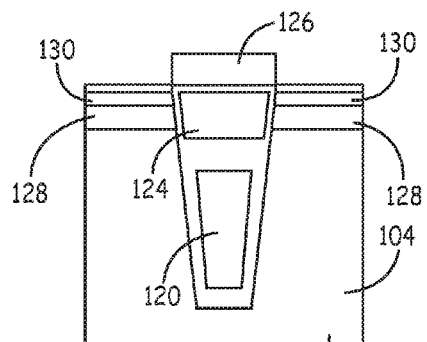
Figure 1M:
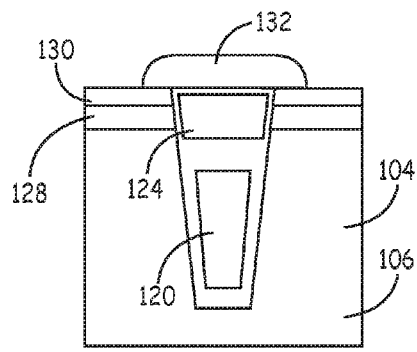
Figure 1N:
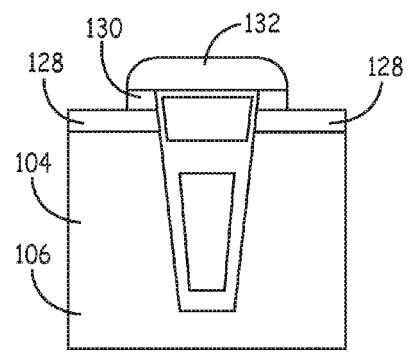

Next, as shown in FIG. 1L, a suitable ion implantation process is utilized to heavily dope the substrate within the n-epitaxial region 104 with n-type semiconductor material, such as, for example, phosphorous, antimony or arsenic, to form an N+ region 130 within the p-channel region 128. As shown in FIG. 1M, a suitable process is then utilized to deposit one or more oxide spacers on the sidewalls of the oxide layer 126 to form an oxide spacer 132. The one or more spacers can be formed utilizing a PVD, CVD, screen printing, spin coating, spray coating, or other suitable oxide deposition process. In one embodiment, for example, the one or more spacers can include TEOS deposited utilizing a high-temperature, low-pressure deposition process, such as vapor deposition. In a second embodiment, the spacers can be formed with one or more layers of SiO2, Si3N4, SiON, Ta2O5, Al2O3, polyimide, BCB, PBO, or other suitable insulating or dielectric material. Next, as shown in FIG. 1N, a suitable silicon etch process is utilized to remove a portion of the n-type material in the N+ region 130 and approximately 0.20 µm of the silicon in the p-channel region 128. Then, as shown in FIG. 1O, a p-type dopant, such as, for example, Boron, Aluminum or Gallium, is deposited by ion implantation with a suitable dosage to form P+ region 134 adjacent the p-channel region 128.

Figure 1O:
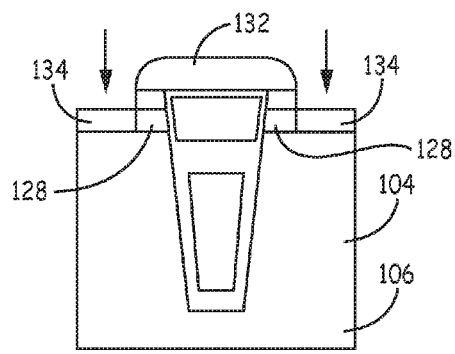
Figure 1P:
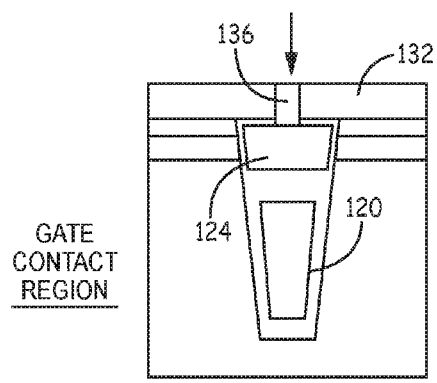
Figure 1Q:
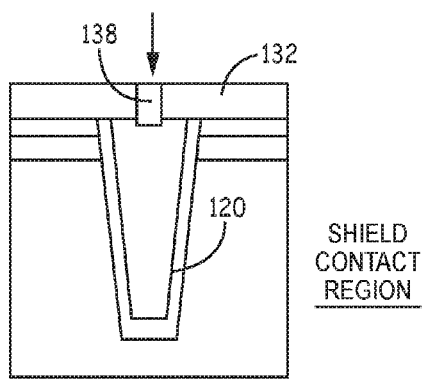
Figure 1R:
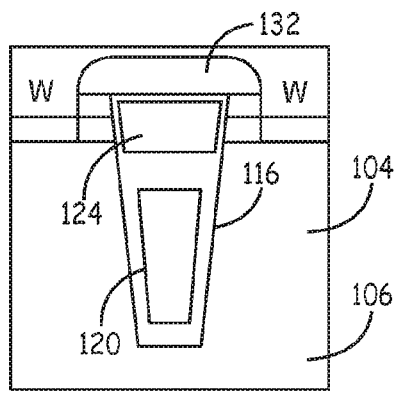

FIG. 1P depicts a cross-sectional view of the gate contact region adjacent the active channel region shown in the cross-sectional view depicted in FIGS. 1A-1O. In FIG. 1P, a PR mask is formed over the insulating layer 132 (e.g., oxide spacer 132 in FIGS. 1A-1O). Utilizing a suitable photolithography process (e.g., oxide dry etch process) is utilized to remove a portion of the insulating layer 132 to form the opening 136 extending to the gate region 124. In a second embodiment, the opening 136 can be formed, for example, utilizing an LDA process. A p-type dopant, such as Boron, Aluminum or Gallium, is deposited by ion implantation into the opening 136 to form a P+ region as an ohmic contact. FIG. 1Q depicts a cross-sectional view of the shield contact region adjacent the active channel region shown in the cross-sectional view depicted in FIGS. 1A-1O. Referring to FIG. 1Q, similarly to the process described directly above with respect to FIG. 1P, an opening 138 is also formed in the insulating layer 132. The opening 138 extends to the shield region 120. A p-type dopant, such as Boron, Aluminum or Gallium, is deposited by ion implantation into the opening 138 to form a P+ region as an ohmic contact. Next, as shown in FIG. 1R, an electrically conductive material is deposited into the openings 136 and 138 utilizing a PVD, CVD, electrolytic plating, electro-less plating, sputtering, or other suitable metal deposition process. In this exemplary embodiment, the electrically conductive material is Tungsten (W) including an adhesion layer of Titanium or Titanium Nitride. However, in a second embodiment, the electrically conductive material can be one or more layers of Al, Cu, Sn, Ni, Au, Ag, or other suitable electrically conductive material.

Figure 1S:
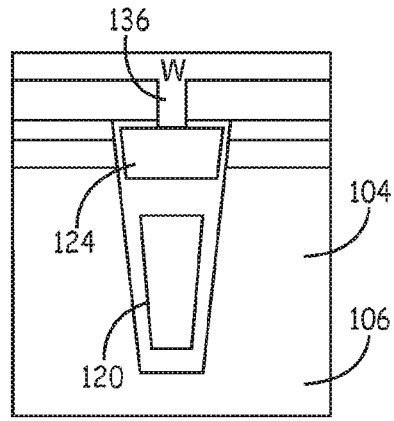
Figure 1T:
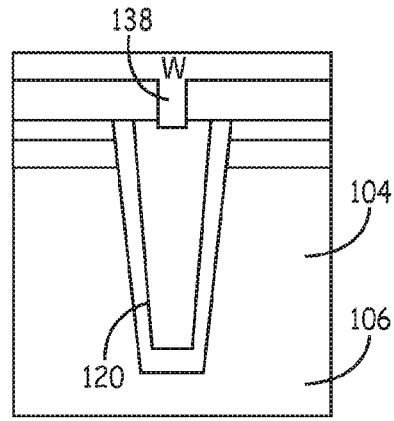

In FIG. 1R, the deposited electrically conductive material (e.g., W) is shown with respect to the cross-sectional view of the active channel region. In FIG. 1S, the deposited electrically conductive material (e.g., W) is shown with respect to the cross-sectional view of the gate contact region. In FIG. 1T, the deposited electrically conductive material (e.g., W) is shown with respect to the cross-sectional view of the shield contact region.

Figure 1U:
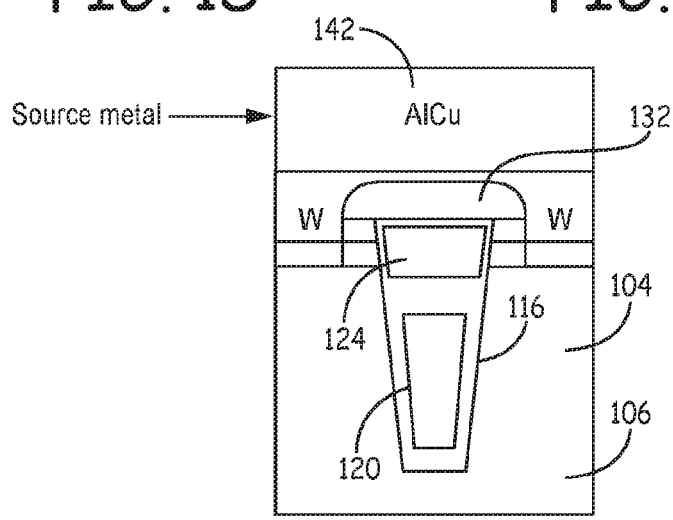
Figures 5A, 5B:
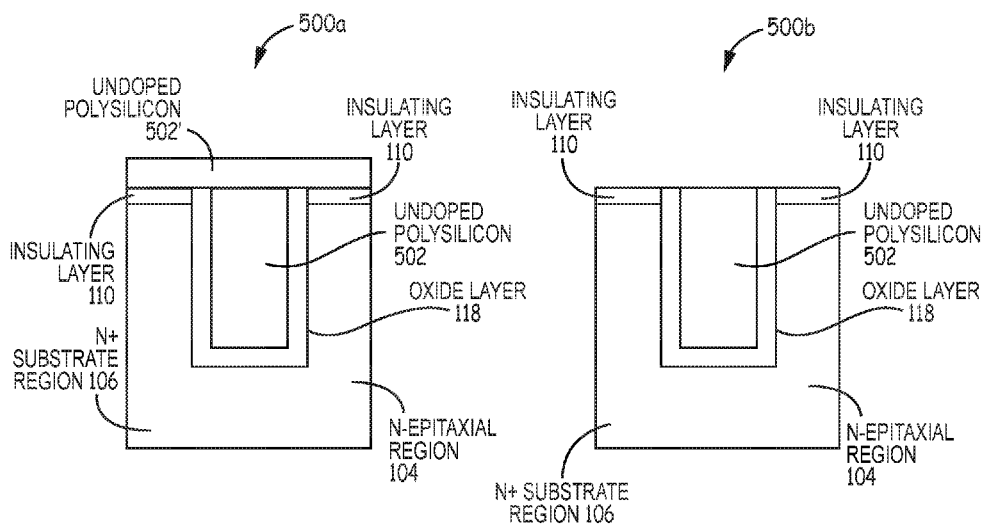
FIGS. 5A-5D depict a second exemplary implantation process that can be utilized to control the dopant type and doping concentration of the p-type shield in order to enable depletion to occur in the exemplary embodiment depicted in FIG. 1E.
Figures 5C, 5D:
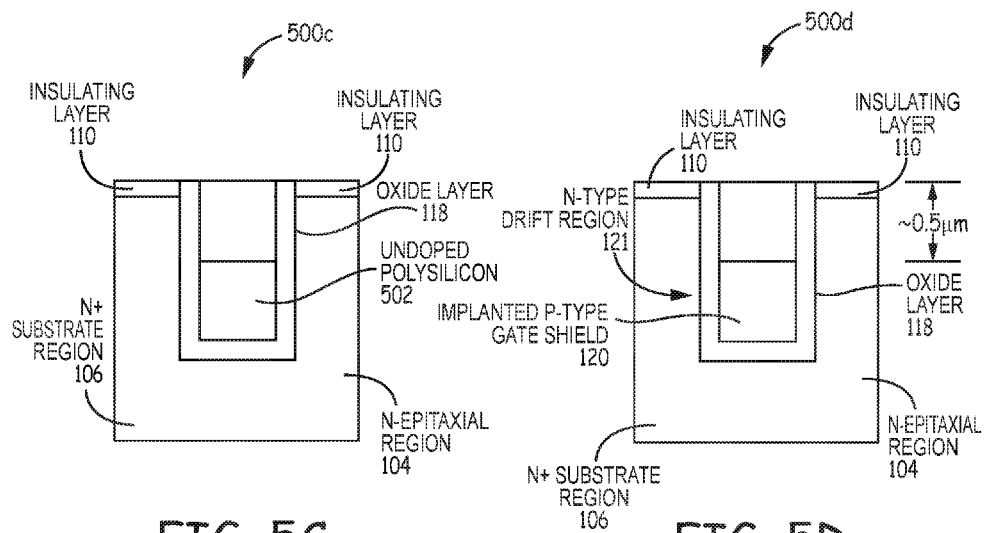

In FIG. 1U, utilizing a suitable metal deposition process, an electrically conductive or metal layer 142 is deposited over the planarized surface of the device 100 as shown. The metal layer 142 is approximately 4 µm thick and formed with an AlCu material. In a second embodiment, the metal layer 142 can formed with one or more layers of Al, Cu, Sn, Ni, Au, Ag, W, or other suitable electrically conductive material. A PR layer or mask is formed and a suitable metal dry etch process is utilized to remove certain portions of the metal layer 142 down to the surface of the silicon. As a result of the etch process, the metal layer 142 forms a source metal interconnect layer that is electrically connected to the N+ (source) region 130 and the p-channel region 128, as shown in the active channel region depicted in FIG. 1U. The etched metal layer also forms a gate metal interconnect layer 144, as shown in the gate contact region depicted in FIG. 1V. The etched metal layer also forms a source metal interconnect layer 146, as shown in the shield contact region depicted in FIG. 1W. A suitable passivation process is then utilized to pattern bond pads or solderable contact pads on the die including the device 100. A suitable wafer thinning process is also performed to reduce parasitic N++ resistances, and the backside 103 of the die is metallized to form the drain metal on the drain region 106.

FIG. 2 depicts a cross-sectional view of a semiconductor device 200 that can be formed utilizing the exemplary method depicted in FIGS. 1A-1W, in accordance with one exemplary embodiment of the present invention. The cross-sectional view depicted in FIG. 2 shows the active channel region of the semiconductor device 200. Referring to FIG. 2, the exemplary semiconductor device 200 includes three trenches (e.g., trench 202). For ease of understanding, since the three trenches are structured virtually identically, only the one trench 202 will be described. The trench 202 includes a polysilicon gate region 204 disposed over a polysilicon (gate) shield region 206. The gate region 204 is electrically and physically isolated from the shield region 206 by a dielectric or insulating region 208. The shield region 206 is electrically connected to the source and thus the source metal layer 210 of the semiconductor device 200. The trench 202 extends into the n-type drift region 212.

Notably, in accordance with the present invention, the (p-type) shield region 206 is doped opposite to that of the (n-type) drift region 212, which enables the shield region 206 to deplete when the semiconductor device 200 is in the "off" state. Consequently, the magnitude of the electrical field in the oxide material 208 adjacent the shield region 206 is significantly reduced, and thereby transfers a substantial amount of the stress generated by the electric field to the polysilicon material of the shield region 206 while the power MOSFET device 200 is in the "off" state. The semiconductor device 200 also includes an N++ substrate 214 that forms a drain region of the semiconductor device 200. The drain region is electrically connected to the drain metal 216. A channel region 218 is formed in the semiconductor device 200 adjacent a trench.

FIGS. 3A-3E depict an exemplary diffusion process 300a-300e that can be utilized to control the dopant type and doping concentration of the p-type shield 120 in order to enable depletion to occur in the exemplary embodiment depicted in FIG. 1E. At process step 300a depicted in FIG. 3A, subsequent to removing the region of field oxide 122 in the trench, as shown in and described with respect to FIG. 1D, the "removed" region is then partially refilled with an undoped polysilicon material 302a. At process step 300b depicted in FIG. 3B, a suitable diffusion process is then utilized to introduce a p-type dopant into the polysilicon material 302b. For example, in this embodiment, a suitable BBr3 (Boron Tribromide) diffusion process can be utilized to introduce the p-type dopant Boron into the polysilicon material 302b. However, in another embodiment, for example, any suitable diffusion process can be utilized to introduce a p-type dopant other than Boron into the polysilicon material 302b.

At process step 300c depicted in FIG. 3C, the unfilled region of the trench 116 is refilled with the undoped polysilicon material to form the undoped and doped p-type polysilicon material 302c. An excess portion of the refilled, undoped polysilicon material is identified as item 302c'. A suitable annealing process (e.g., rapid thermal annealing at low temperature) is then utilized to relieve internal stresses in the doped and undoped polysilicon materials 302c and 302c'. At process step 300d depicted in FIG. 3D, a suitable CMP process is then utilized to smooth and planarize the surface of the polysilicon material 302c' down to the surface of the nitride material of the hard mask and/or insulating layer 110 to form the undoped and p-type polysilicon material 302d. At process step 300e depicted in FIG. 3E, a suitable photolithography process is then utilized to etch back the undoped and p-type polysilicon material to form the p-type shield 120. A suitable PR mask is utilized to protect the shield contact regions during the etching process. Notably, for this exemplary embodiment, the distance from the planarized surface of the nitride material of the insulating layer 110 to the p-type gate shield 120 is approximately 0.5 µm. Also, for this embodiment, the dopant concentration of the depleted gate shield 120, which is a dopant type (e.g., p-type) opposite to that of the drift region 121 adjacent the trench (e.g., n-type), is approximately 1E17 cm-3 (approximately the same dopant concentration as that of the drift region 121).

FIGS. 4A-4E depict an exemplary implantation process 400a-400e that can be utilized to control the dopant type and doping concentration of the p-type shield 120 in order to enable depletion to occur in the exemplary embodiment depicted in FIG. 1E. At process step 400a depicted in FIG. 4A, subsequent to removing the region of field oxide 122 in the trench, as shown in and described with respect to FIG. 1D, the "removed" region is then completely refilled with an undoped polysilicon material 402a. The excess undoped polysilicon material that overflows the trench is depicted as item 402a'. At process step 400b depicted in FIG. 4B, a suitable CMP process is then utilized to smooth and planarize the surface of the undoped polysilicon material 402a' and remove the excess polysilicon material 402a' down to the surface of the nitride material of the hard mask and/or insulating layer 110. The remaining undoped polysilicon material is identified as item 402b. At process step 400c depicted in FIG. 4C, a suitable implantation process is then utilized to introduce a p-type dopant into the polysilicon material 402 to form the p-type polysilicon material 402c. For example, in this embodiment, a suitable ion implantation process can be utilized to introduce the p-type dopant Boron into the polysilicon material 402b. However, in another embodiment, for example, any suitable implantation process can be utilized to introduce a p-type dopant other than Boron into the polysilicon material 402b to form the p-type polysilicon material 402c.

At process step 400d depicted in FIG. 4D, a suitable annealing process (e.g., rapid thermal annealing at low temperature) is then utilized to relieve internal stresses in the p-type polysilicon material 402c to form the p-type polysilicon material 402d. At process step 400e depicted in FIG. 4E, a suitable photolithography process is then utilized to etch back the p-type polysilicon material 402d to form the p-type gate shield 120. A suitable PR mask is utilized to protect the shield contact regions during the etching process. Notably, for this exemplary embodiment, the distance from the planarized surface of the nitride material of the insulating layer 110 to the p-type gate shield 120 is approximately 0.5 µm. Also, for this embodiment, the dopant concentration of the depleted gate shield 120, which is a dopant type (e.g. p-type) opposite to that of the drift region 121 adjacent the trench (e.g., n-type), is approximately 1E17 cm-3 (approximately the same dopant concentration as that of the drift region 121).

FIGS. 5A-5D depict a second exemplary implantation process 500 that can be utilized to control the dopant type and doping concentration of the p-type shield 120 in order to enable depletion to occur in the exemplary embodiment depicted in FIG. 1E. At process step 500a depicted in FIG. 5A, subsequent to removing the region of field oxide 122 in the trench, as shown in and described with respect to FIG. 1D, the "removed" region is then completely refilled with an undoped polysilicon material 502. The excess polysilicon material that overflows the trench is depicted as item 502'. At process step 500b depicted in FIG. 5B, a suitable CMP process is then utilized to smooth and planarize the surface of the polysilicon material 502' and remove the excess polysilicon material 502' down to the surface of the nitride material of the hard mask and/or insulating layer 110. At process step 500c depicted in FIG. 5C, a suitable photolithography process is then utilized to etch back the polysilicon material 502 to form the undoped polysilicon for the gate shield 120. A suitable PR mask is utilized to protect the shield contact regions during the etching process. At process step 500d depicted in FIG. 5D, a suitable implantation process is then utilized to introduce a p-type dopant into the polysilicon material 502. For example, in this embodiment, a suitable ion implantation process can be utilized to introduce the p-type dopant Boron into the polysilicon material 502 to form the p-type gate shield 120. However, in another embodiment, for example, any suitable implantation process can be utilized to introduce a p-type dopant other than Boron into the polysilicon material 502 to form the p-type gate shield 120. Notably, for this exemplary embodiment, the distance from the planarized surface of the nitride material of the insulating layer 110 to the p-type gate shield 120 is approximately 0.5 µm. Also, for this embodiment, the dopant concentration of the depleted gate shield 120, which is a dopant type (e.g., p-type) opposite to that of the drift region 121 adjacent the trench (e.g., n-type), is approximately 1E17 cm-3 (approximately the same dopant concentration as that of the drift region 121).

FIGS. 6A-6C depict an exemplary in-situ doping process 600a-600c that can be utilized to control the dopant type and doping concentration of the p-type shield 120 in order to enable depletion to occur in the exemplary embodiment depicted in FIG. 1E. At process step 600a depicted in FIG. 6A, subsequent to removing the region of field oxide 122 in the trench, as shown in and described with respect to FIG. 1D, the "removed" region is then completely refilled with a p-type polysilicon material 602. The excess p-type polysilicon material that overflows the trench is depicted as item 602'. For example, the in-situ process 600 described herein can be utilized to introduce the p-type dopant Boron to form the p-type polysilicon material 602 and 602'. However, in another embodiment, for example, any suitable in-situ doping process can be utilized to introduce a p-type dopant other than Boron to form the p-type polysilicon material 602 and 602'. At process step 600b depicted in FIG. 6B, a suitable CMP process is then utilized to smooth and planarize the surface of the p-type polysilicon material 602 and remove the excess p-type polysilicon material 602' down to the surface of the nitride material of the hard mask and/or insulating layer 110. At process step 600c depicted in FIG. 6C, a suitable photolithography process is then utilized to etch back the p-type polysilicon material 602 to form the p-type gate shield 120. A suitable PR mask is utilized to protect the shield contact regions during the etching process. Notably, for this exemplary embodiment, the distance from the planarized surface of the nitride material of the insulating layer 110 to the p-type gate shield 120 is approximately 0.5 µm. Also, for this embodiment, the dopant concentration of the depleted gate shield 120, which is a dopant type (e.g., p-type) opposite to that of the drift region 121 adjacent the trench (e.g., n-type), is approximately 1E17 cm-3 (approximately the same dopant concentration as that of the drift region 121).

Figure 7:
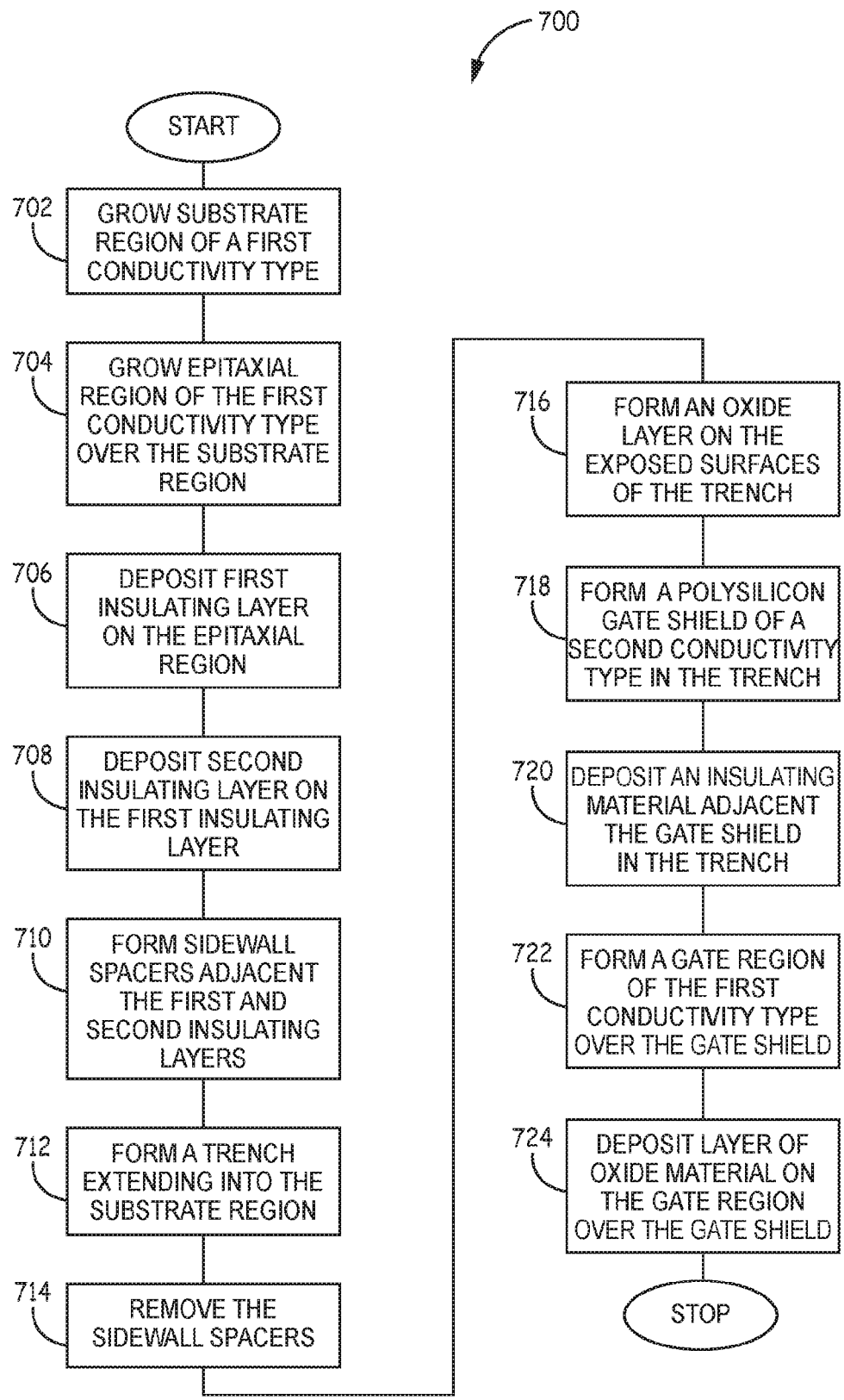
FIG. 7 is a flow diagram of a method that can be utilized to manufacture a semiconductor device with a depleted gate shield, in accordance with one exemplary embodiment of the present invention.

FIG. 7 is a flow diagram of a method 700, which can be utilized to manufacture a semiconductor device with a depleted gate shield, in accordance with one exemplary embodiment of the present invention. Note that for this exemplary embodiment, the semiconductor device is an N-MOS device (e.g., dopant species for an N-channel MOSFET device). However, a second embodiment can utilize the opposite dopant type species to from a P-channel MOSFET (P-MOS) device. For that embodiment, all of the conductivity types described herein for the N-MOS device would have the opposite conductivity types for a P-MOS device. In any event, for this exemplary embodiment, as depicted in FIG. 1A, a substrate region 102 is formed (e.g., grown) with a semiconductor material of a first (n-type or N+) conductivity type (702). Next, an epitaxial region 104 is formed (e.g., grown) with the first conductivity type (n-epitaxial region) over the N+ substrate (drain) region 106 (704). A first insulating layer (e.g., thermal oxide layer) 108 is then formed (e.g., deposited) on the epitaxial region 104 (706). Next, a second insulating layer (e.g., dielectric layer) 110 is formed (e.g., deposited) on the first insulating layer 108 (708). Referring to FIG. 1B, after etching portions of the first and second insulating layers 108, 110 down to the active surface 101 of polysilicon, a suitable CMOS process is utilized to form a first sidewall spacer 112 and second sidewall spacer 114 adjacent to the exposed sides of the first and second insulating layers 108, 110 (710). Next, a suitable process (e.g., etch or LDA) is utilized to form a trench 116 through the first and second insulating layers 108, 110, the n-epitaxial region 104, and partially into the N+ substrate region 106 (712). A suitable etch process (e.g., oxide wet etch) is then utilized to remove the first and second sidewall spacers 112, 114 (714).

Referring to FIG. 1D, a suitable oxide layer 118 is formed (e.g., grown) on the exposed surfaces of the trench 116 (716). Next, as depicted in FIG. 1E, a polysilicon material with a second conductivity type is deposited in the trench 116 to form a (e.g., p-type) gate shield 120 (718). The trench 116 is then filled (e.g., deposited) with a suitable oxide material to form a field oxide layer or insulating region 122 adjacent to the gate shield 120 in the trench 116 (720). The surface of the oxide layer can be planarized as required. As depicted in FIG. 1F, a suitable oxide etch process is utilized to remove a portion of the oxide region 122 over the gate shield 120, and the removed region is then refilled with a polysilicon material with the first conductivity type (e.g., N+) to form a gate structure or region 124 (722). As depicted in FIG. 1G, utilizing a suitable etch process, a portion of the polysilicon material in the gate region 124 is removed down to the surface of the oxide layer 108, and a suitable (e.g., thermal) oxidation process is utilized to oxidize the polysilicon material in the gate region 124 to a depth of approximately 20 nm. As depicted in FIG. 1H, utilizing a suitable oxide deposition process, a layer 126 of a suitable oxide material (e.g., SiO2) is deposited on the oxidized surface of the gate polysilicon region 124 and then planarized as required (724).

Figure 8:
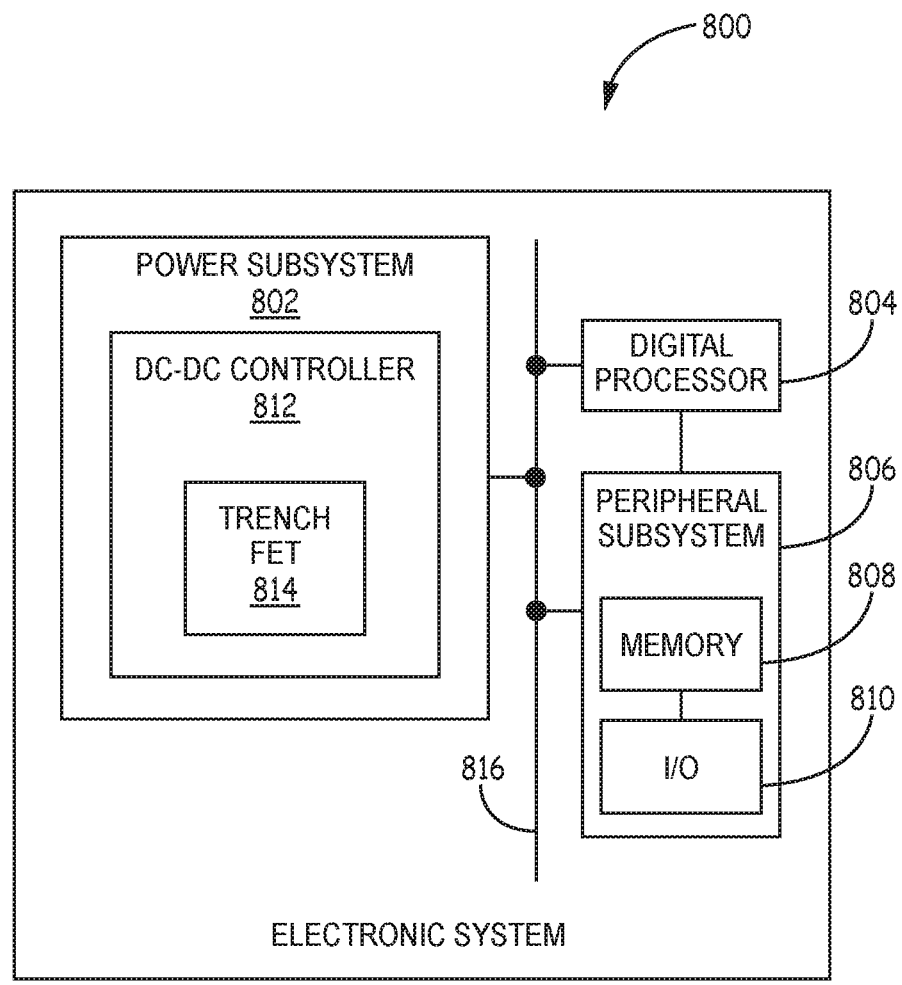
FIG. 8 depicts a schematic block diagram of an electronic system that can be utilized to implement one exemplary embodiment of the present invention.

FIG. 8 is a schematic block diagram of an electronic system 800, which can be utilized to implement one exemplary embodiment of the present invention. In the exemplary embodiment shown, electronic system 800 includes a power subsystem 802, a digital processor unit 804, and a peripheral subsystem 806. For example, the digital processor unit 804 can be a microprocessor or microcontroller and the like. The peripheral subsystem 806 includes a memory unit 808 for storing the data processed by the digital processor unit 804, and an input/output (I/O) unit 810 for transmitting and receiving the data to/from the memory unit 808 and the digital processor unit 804. In the exemplary embodiment depicted in FIG. 8, the power subsystem 802 includes a DC-DC controller 812, and a power trench MOSFET device 814 including a depleted gate shield (e.g., p-type gate shield 120 depicted in and described with respect to FIGS. 1A-6C) utilized to enable and disable the conduction of large currents in the DC-DC controller 812. The DC-DC controller 812 and power subsystem 802 provide a regulated voltage via line 816 to power the electronic components in the digital processor unit 804 and peripheral subsystem 806. In the exemplary embodiment shown, the power trench MOSFET device 814 with a depleted gate shield can be implemented, for example, utilizing the power trench MOSFET device 100 with the depleted gate shield 120 depicted in and described with respect to FIGS. 1A-1W, 2, and 3A-6C. In one or more exemplary embodiments, the components of the electronic system 800 can be implemented in one or more integrated circuits, wafers, chips or dies.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that the present application be limited only by the claims and the equivalents thereof.

What is claimed is:

1. A method of manufacture of a semiconductor device, comprising:
providing a semiconductor substrate doped with a first carrier type;
forming a trench in the semiconductor substrate;
forming a first polysilicon structure in the trench;
doping the first polysilicon structure in the trench with a second carrier type, wherein the forming the first polysilicon structure and doping the first polysilicon structure comprises forming a depleted gate shield;
forming a second polysilicon structure in the trench and over the first polysilicon structure;
doping the second polysilicon structure with the first carrier type; and
forming an insulating material between the first polysilicon structure and the second polysilicon structure, and at least a sidewall of the trench.

2. The method of claim 1, wherein the providing comprises growing the semiconductor substrate, and doping the semiconductor substrate with the first carrier type.

3. The method of claim 2, wherein the doping the semiconductor substrate with the first carrier type comprises doping with an n-type material.

4. The method of claim 2, wherein the doping the semiconductor substrate with the first carrier type comprises doping with a p-type material.

5. The method of claim 1, further comprising forming an epitaxial region doped with the first carrier type in the semiconductor substrate and adjacent to the trench.

6. The method of claim 1, wherein the forming the second polysilicon structure and doping the second polysilicon structure comprises forming a gate structure.

7. The method of claim 1, further comprising electrically coupling the depleted gate shield to a source region of the semiconductor device.

8. The method of claim 1, wherein the forming the insulating material between the first polysilicon structure and the second polysilicon structure, and at least a sidewall of the trench comprises depositing a dielectric material in the trench.

9. The method of claim 1, wherein the forming the first polysilicon structure and doping the first polysilicon structure comprises partially filling the trench with a first layer of a polysilicon material, diffusing the first layer of the polysilicon material with a dopant having the second carrier type, partially filling the trench with a second layer of the polysilicon material, etching the first layer and the second layer of polysilicon material, and thereby forming a depleted gate shield.

10. The method of claim 1, wherein the forming the first polysilicon structure and doping the first polysilicon structure comprises filling the trench with a layer of a polysilicon material, implanting the layer of polysilicon material with a dopant having the second conductivity type and thereby forming a doped layer of polysilicon material, and etching the doped layer of polysilicon material and thereby forming a depleted gate shield.

11. The method of claim 1, wherein the forming the first polysilicon structure and doping the first polysilicon structure comprises filling the trench with a layer of a polysilicon material, etching the layer of polysilicon material and thereby forming a polysilicon gate shield, and implanting the polysilicon gate shield with a dopant having the second conductivity type and thereby forming a depleted gate shield.

12. The method of claim 1, wherein the forming the first polysilicon structure and doping the first polysilicon structure comprises filling the trench with a doped polysilicon material having the second conductivity type, and etching the doped polysilicon material and thereby forming a depleted gate shield.

13. The method of claim 1, wherein the forming the depleted gate shield includes controlling the doping the first polysilicon structure such that the depleted gate shield is substantially depleted when the semiconductor device is turned off.

14. The method of claim 1, wherein the forming the depleted gate shield includes controlling the doping the first polysilicon structure such that a doping concentration of the depleted gate shield is approximately 1E17 cm-3.

15. The method of claim 1, further comprising forming a drift region in the trench, wherein the forming the depleted gate shield includes controlling the doping the first polysilicon structure such that the depleted gate shield has a doping concentration that is substantially the same as a doping concentration of the drift region.

16. The method of claim 15, wherein forming the drift region includes doping the drift region with the first carrier type.

* * * * *